(12) United States Patent
Tailliet et al.

(10) Patent No.: US 8,717,820 B2
(45) Date of Patent: May 6, 2014

(54) FLOATING ADDRESSING OF AN EEPROM MEMORY PAGE

(75) Inventors: Francois Tailliet, Fuveau (FR); Yvon Bahout, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/599,222

(22) Filed: Aug. 30, 2012

(65) Prior Publication Data

US 2013/0051153 A1    Feb. 28, 2013

(30) Foreign Application Priority Data

Aug. 30, 2011 (FR) ...................... 11 57659

(51) Int. Cl.
*G11C 16/04* (2006.01)
*G11C 8/00* (2006.01)

(52) U.S. Cl.
USPC ............. 365/185.18; 365/230.01; 365/230.03

(58) Field of Classification Search
USPC .................................. 365/185.18
See application file for complete search history.

(56) References Cited

U.S. PATENT DOCUMENTS

| | | | |
|---|---|---|---|
| 5,774,413 A | 6/1998 | Hunt | |
| 6,813,677 B1 * | 11/2004 | Gupta | ...................... 365/189.07 |
| 7,061,815 B2 * | 6/2006 | Ahmad | ........................ 365/200 |
| 7,730,276 B1 * | 6/2010 | Kavipurapu et al. | ......... 711/168 |
| 8,301,949 B2 * | 10/2012 | Guo | ............................... 714/746 |
| 2003/0161206 A1 | 8/2003 | Wilford et al. | |
| 2010/0124102 A1 | 5/2010 | Lee et al. | |

FOREIGN PATENT DOCUMENTS

| | | |
|---|---|---|
| WO | 2006066897 | 6/2006 |
| WO | 2006066897 A1 | 6/2006 |

* cited by examiner

*Primary Examiner* — Son Mai
(74) *Attorney, Agent, or Firm* — Allen, Dyer, Doppelt, Milbrath & Gilchrist, P.A.

(57) ABSTRACT

A method for electrically programming a non-volatile memory in which a programming cycle includes prior addressing of memory cells from an initial address corresponding to a first row and a column of a memory plane. The method may include addressing the memory cells in a second consecutive row when the end of the first row is reached to store data on bits with consecutive and increasing addresses in two consecutive rows.

15 Claims, 5 Drawing Sheets

BSWLg(r-1)r, BSWLgr(r+1)

FLOATING ADDRESSING OF AN EEPROM MEMORY PAGE

FIELD OF THE INVENTION

The present document relates to a method for managing an electrically programmable memory, comprising the writing or programming, and/or the erasing of the memory. It also relates to a part of a memory or a memory allowing the implementation of the management method. Moreover, it relates to a method for fabricating such a memory part. Finally, it relates to an electronic device or system which comprises at least one such electrically programmable memory.

BACKGROUND OF THE INVENTION

According to a widespread architecture of the prior art, an electrically erasable and programmable memory, such as an electrically erasable programmable read only memory (EEPROM), comprises memory cells. Each memory cell includes a floating gate transistor and an access transistor of a metal oxide semiconductor (MOS) type and organized in a memory plane according to a matrix of n×m cells disposed in n rows (or lines) and m columns. Each memory cell is situated at the intersection of a word line and of a bit line. In such a structure of the prior art, a set of memory cells connected to the same word line within a row is called a physical page of the memory. The memory plane of such a memory is a set of pages.

FIG. 1 represents an example of an EEPROM memory part according to such an architecture. More precisely, this memory part comprises two columns and four rows, with which the four word lines $WL_i$ to $WL_{i+3}$ are associated. In each of these rows, each column comprises eight bit lines (respectively BL0 to BL7 and BL8 to BL15) linked to eight memory cells. In this example represented, these eight cells disposed at each intersection of a column and of a row thus form a memory byte.

FIG. 2 more precisely represents such a memory byte. Each memory cell of this byte, such as the highlighted cell $C_{i0}$, comprises a floating gate transistor FGT and an access transistor AT as recalled hereinabove. The latter has its gate G connected to the word line $WL_i$, its drain D connected to a bit line $BL_0$, and its source S connected to the drain D of the floating gate transistor FGT. The latter has its source connected to a source line LS and its control gate G connected to a gate control line $CGL_0$ by way of a gate control transistor $CGT_0$, whose gate is linked to the word line $WL_i$, whose drain D is connected to the gate selection line $CGL_0$, and whose source S is connected to a potential common to the eight control gates of the floating gate transistors FGT. The gate selection line $CGL_0$ extends over all the pages of the memory plane in a similar manner to the bit lines and links the gates of the floating gate transistors of each cell of the same column by way of the gate control transistor CGT. It should be noted that a source line LS extends in a similar manner to link the sources of each cell to the same source voltage, as explained previously.

In such a memory, each cell Cij may include a binary information item, which may be modified by a programming operation, which includes trapping electrical charge in the floating gate of the floating gate transistor FGT, or by an erasure operation, and which includes extracting charge from this floating gate. These operations of erasing or programming a memory cell, and more particularly, the floating gate transistor FGT of the cell, are done for example, by a tunnel effect (Fowler Nordheim effect). As a result, an erased floating gate transistor exhibits a greater threshold voltage than that of the programmed transistor. When a read voltage Vread chosen between these two threshold voltage values is applied to the control gate of such an floating gate transistor FGT, it remains off if it is in an erased state and on if it is in a programmed state, thereby making it possible to easily detect its state and to associate with it a binary value representing a stored data bit.

According to a routine scheme of the prior art, collective erasure of the floating gate transistors is achieved by applying a voltage of 15 to 20 V to the control gate of the floating gate transistors by way of the gate control transistor $CGT_0$, while the source line is at 0 and the drain of the floating gate transistors is at a floating potential. The individual programming of floating gate transistors is achieved by applying the programming voltage Vpp to the drains of the floating gate transistors via the access transistors AT, while the control gate of the floating gate transistors is at 0 and the source line is at a floating potential.

FIG. 3 represents, more globally and schematically, a plane of such an EEPROM memory, comprising eight columns of 8 bits and 32 rows, i.e. a total of 2048 bits. Each word line $WL_i$, not represented, of the memory plane is controlled by a voltage signal delivered by an output of a line decoder RDEC. Each column selection line $CGL_i$ receives a voltage from a column latch, not represented, in cooperation with a column decoder CDEC. Likewise, each bit line BLj is linked to a programming latch, not represented, and to a column decoder CDEC, so as to send it the signal for a desired operation. Finally, each source line LS is connected to a floating potential. In this figure, the memory plane thus comprises several pages disposed successively over the various rows, each page including the page $P_i$ considered, therefore comprising eight bytes, including the two bytes $O_{i0}$ and $O_{i1}$ highlighted by way of example, which are disposed at the intersections of this row i with columns 0 and 1, and are each associated with a gate control line $CGL_0$, $CGL_1$.

In practice, a programmable memory, such as this, is associated with a programming method which manages write commands so as to trigger programming cycles, a prior step of which comprises the definition of a starting address for writing a certain data item to the memory. This address includes the definition of the write row concerned, as well as the column where writing begins. Thereafter, another prior step comprises the activation of all the latches of bit lines whose bits are involved in the write so as thereafter to undertake the programming cycle. During the latter, all the desired latches of the memory have been activated. Thereafter, each programming cycle firstly comprises a cycle of erasing all the bits of the bytes involved in the write and then a write cycle as such in which the programming potential Vpp of the memory is brought to its programming value, thereby ultimately allowing the simultaneous and automatic programming of all the bits that take the value "1", such as are defined by the data to be stored.

In practice, such a write cycle is implemented by commencing the writing of the data to be stored at the first column of a chosen row, and the size of the data to be stored remains less than or equal to the size of a page. However, if the beginning of programming is initiated on an intermediate column of the memory plane, and if the end of the row is reached, that is to say column 7 is completely written, returning to the example related to FIG. 3, the programming then uses column 0 and so on and so forth over the same row. All the data are therefore written on the same page $P_i$ corresponding to the single row i addressed by the write cycle. This approach thus presents the drawback of not systematically positioning all the data in an increasing order of the addresses of the bits of the memory, thereby greatly complicating the organization and utilization of these stored data.

To alleviate this drawback, provisions may be made so that the programming cycles for an electronic memory do not overstep the end of a row during a programming cycle, which uses for this purpose preferably the beginning of a row of the memory plane as initial storage address. This writing constraint represents, however, a lack of flexibility in the utilization of an electrically programmable memory. Thus, it may be desirable to improve the programming of an electrically programmable memory which makes it possible to deal with the drawback mentioned hereinabove.

SUMMARY OF THE INVENTION

For this purpose, the embodiments rest upon a method for electrically programming a non-volatile memory, in which a programming cycle comprises the prior addressing of memory cells from an initial address of the memory corresponding to a first row i and a column j of a memory plane. The method includes the addressing of memory cells in a second consecutive row i+1 when the end of the first row i is reached, so as ultimately to store data on bits with consecutive and increasing addresses in two consecutive rows i, i+1.

The method for electrically programming a non-volatile memory may comprise a step of automatically modifying the state of global word line selection lines, which pass from a first state "0-1" to the second opposite state "1-0", when the end of the first row i is reached, so as to address the cells of the successive row i+1 from the first column of the memory plane for the continuation of the phase of positioning write latches of the memory. The method for electrically programming a non-volatile memory may comprise a step of detecting the end of the first row i of the memory plane and then a step of activating at least one switch to continue the addressing of the consecutive second row i+1.

The electrical programming method can implement a change of row by linking the same global word line to a first local word line of the last column of the first row i, and then to the local word line of the first column of the second row 1+1.

The method for electrically programming a non-volatile memory may comprise continuously incrementing the bits of the memory plane for data of greater size than that of a page of the memory plane to be stored. The method may include, when the size of the processed data exceeds the size of a page of the memory plane, incrementing the global word line, and passing from a first global word line to a consecutive second global word line. The method also may include, at the same time, inversion of the output values (r−1)r and r(r+1) of a global word line selection latch so that the local word line which was linked to the first global word line is linked to the second global word line.

The embodiments also pertain to a memory plane for electrically programmable non-volatile memory comprising memory cells distributed in columns and rows and including a device suitable for the implementation of the programming method such as described previously. The memory cells of a row i and of a column j may be linked to a local word line and to bit lines, and the memory plane may comprise at least one switch to optionally link the local word line to a programming voltage. The memory plane may include two switches driven respectively by two global word line selection lines to optionally link the local word line to a programming voltage or to a non-programming voltage.

Each local word line may extend only over one column in a row i, and be joined to the gate of a transistor of each cell of the column, whose drain is connected to a bit line. The link to the programming voltage for a local word line may be achieved by a link to a global word line extending over the whole length of the memory plane, suitable for an electrical link with all the columns of the memory plane.

The memory plane may comprise, per column, two global word line selection lines and a global word line selection line latch which may make it possible to provide, as output, two opposite logic signals applied to each of these two global word line selection lines to select a row to be programmed from among two possible rows i, i+1 when a global word line is addressed by a write command. Each memory cell may comprise a floating gate transistor and an access transistor whose gate is connected to the local word line, whose drain D is connected to a bit line, and whose source is connected to the drain of the floating gate transistor. The floating gate transistor may have its control gate connected to a gate control line by way of a gate control transistor, whose gate is linked to the local word line.

The embodiments also pertain to an electrically programmable non-volatile memory that includes at least one memory plane such as described hereinabove. The memory may be an EEPROM memory. The embodiments also pertain to an electronic device that includes at least one electrically programmable non-volatile memory such as described hereinabove.

Finally, the embodiments pertain to a method for fabricating a memory plane of electrically programmable non-volatile memory. The method includes producing conductors forming global word lines extending over the whole length of the memory plane, producing conductors forming the local word lines extending over a single column of a row of the memory plane, and producing transistors forming switches disposed between the global word lines and the local word lines. The method also includes producing conductors forming global word line selection lines and extending in the direction substantially perpendicular to the global word lines, and joined to the transistors forming the switches to transmit signals for controlling their configuration to them.

DETAILED DESCRIPTION OF THE PREFERRED EMBODIMENTS

In the various figures, the same references are used for the sake of clarity and comprehension. An embodiment rests upon a programming method which implements the principle of changing write row during a write cycle. Thus, all the addressed bits are continuously incremented whatever the starting address for addressing a memory plane during a write cycle.

Figure 4:
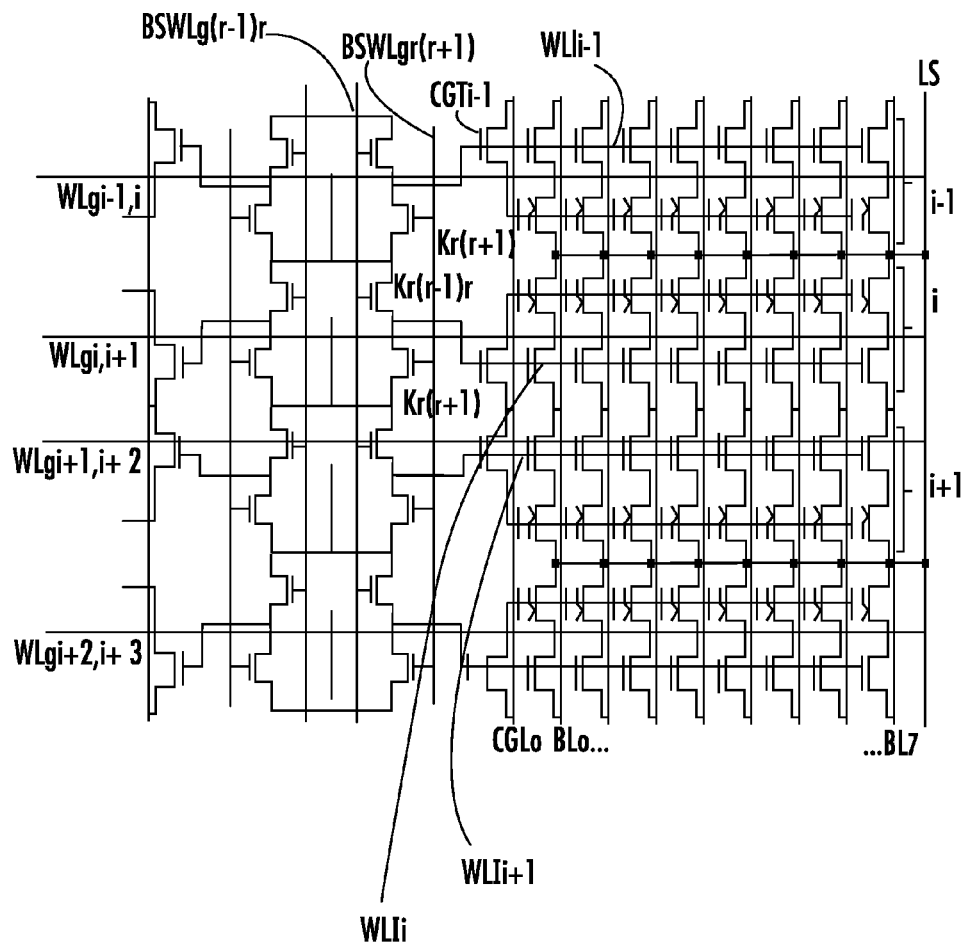
FIG. 4 is a schematic diagram of the structure of an electrically programmable memory part according to an embodiment of the present invention.

An embodiment of a memory architecture for the implementation of such a programming method will now be described. FIG. 4 represents, by way of example, a column of eight bits on four rows (or lines) i−1 to i+2 of an EEPROM memory according to such an architecture. The memory still comprises eight bit lines (respectively BL0 to BL7) linked respectively to the eight memory cells of each row. According to the embodiment, each word line previously described with reference to the prior art is replaced with, on the one hand, a local word line $WLl_i$ per row i, which extends over a single column (a byte in the case represented), and, on the other hand, with a global word line $WLg_{i,\,i+1}$, which extends over the whole length of the memory plane, and is able to be linked to two successive rows i, i+1, as will be explained.

The memory plane comprises, moreover, for each column two global word line selection lines $BSWLg_{(r-1)r}$ and $BSWLg_{r(r+1)}$, which take two opposite voltage values, termed "0" or "1" by convention, the value "0" corresponding to a zero or very low voltage and the value "1" to a programming voltage Vpp, so that each respectively drives an MOS transistor, fulfilling a switch function $K_{(r-1)r}$, $K_{r(r+1)}$, at the level of each byte. These two switches make it possible, depending on their configuration, to link the local word line $WLl_i$ of a particular byte to the global word line above $WLg_{i,i+1}$ or below $WLg_{i-1,i}$. For example, if the global word line $WLg_{i,i+1}$ receives a programming voltage during a write cycle, such as recalled previously, and if the global word line selection line BSWLg(r−1) takes the value 0 and the global word line selection line $BSWLg_{r(r+1)}$ takes the value 1, then the two switches $K_{(r-1)r}$, $K_{r(r+1)}$ take a configuration which electrically links the local word line $WLl_i$ of row i to the global word line $WLg_{i,i+1}$.

It follows from this that when a particular global word line is selected with a view to a programming step in a similar way to the manner of operation of the prior art, it is possible to link it to the local word line of a row above or below, thereby making it possible to program the cells in two distinct successive rows. Therefore two successive rows of the memory plane are addressed during the same programming operation of the same programming cycle.

Thereafter, the remainder of the architecture at the level of a particular byte remains similar to the description in relation to the prior art. Each memory cell comprises a floating gate transistor and an access transistor whose gate is connected to the local word line, whose drain is connected to a bit line $BL_j$, and whose source is connected to the drain of the floating gate transistor. The control gate of the floating gate transistor is connected to a gate control line, by way of a gate control transistor $CGT_i$, whose gate is linked to the local word line $WLl_i$, whose drain is connected to a gate selection line, and whose source S is connected to the potential common to the control gates of the floating gate transistors of the byte. Thus, this architecture exhibits the advantage of remaining compatible with the programming method of the prior art. The local word line fulfills the same function as the word line of the prior art, while affording the possibility of changing write row.

Figure 1:
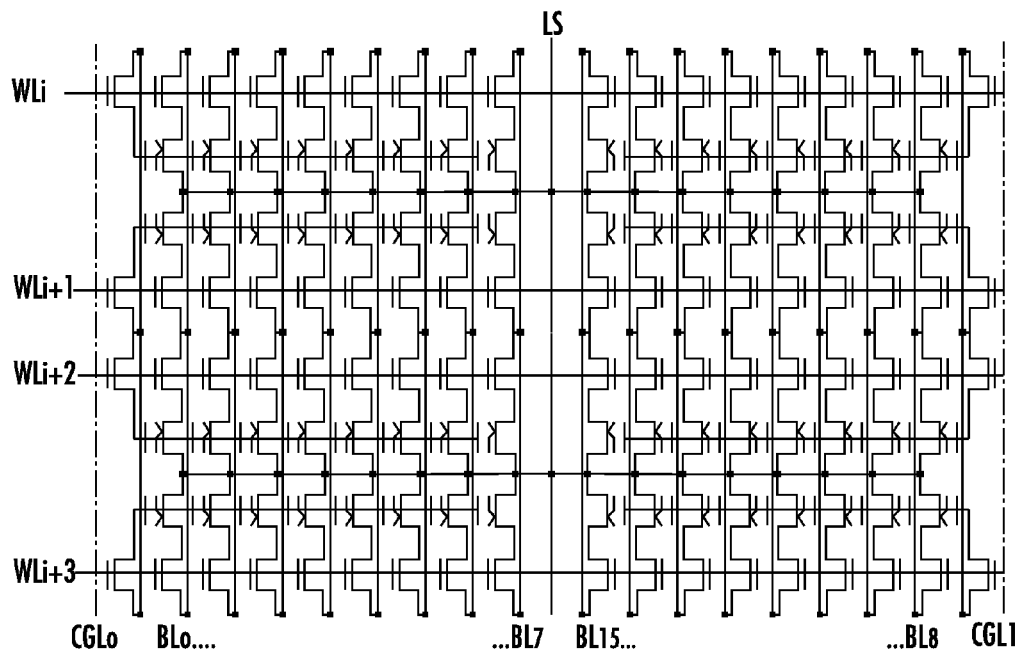
FIG. 1 is a schematic diagram of a structure of an electrically programmable memory part according to a prior art.
Figure 2:
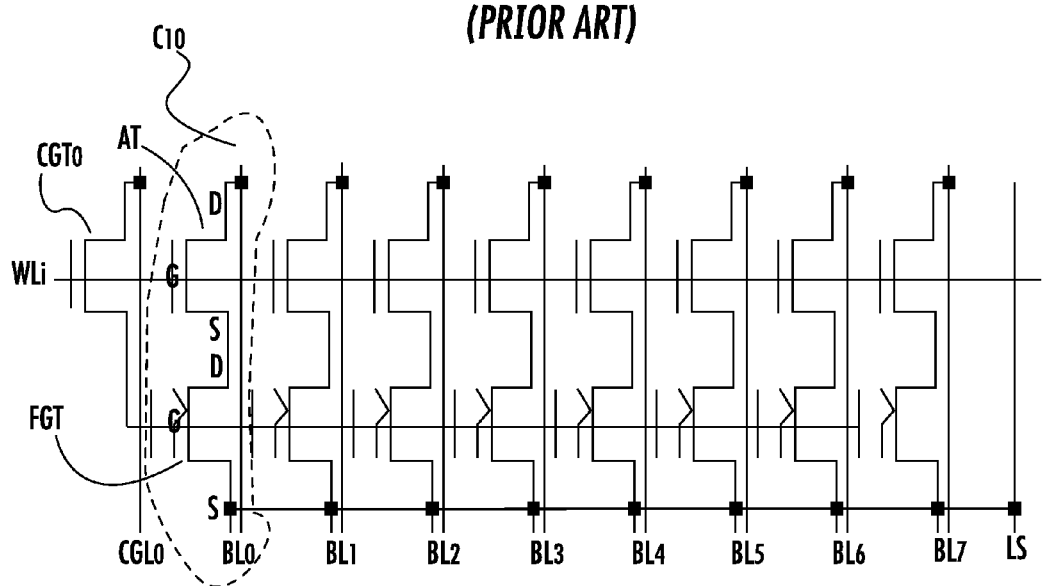
FIG. 2 is a schematic diagram of a byte of the electrically programmable memory according to the prior art.
Figure 3:
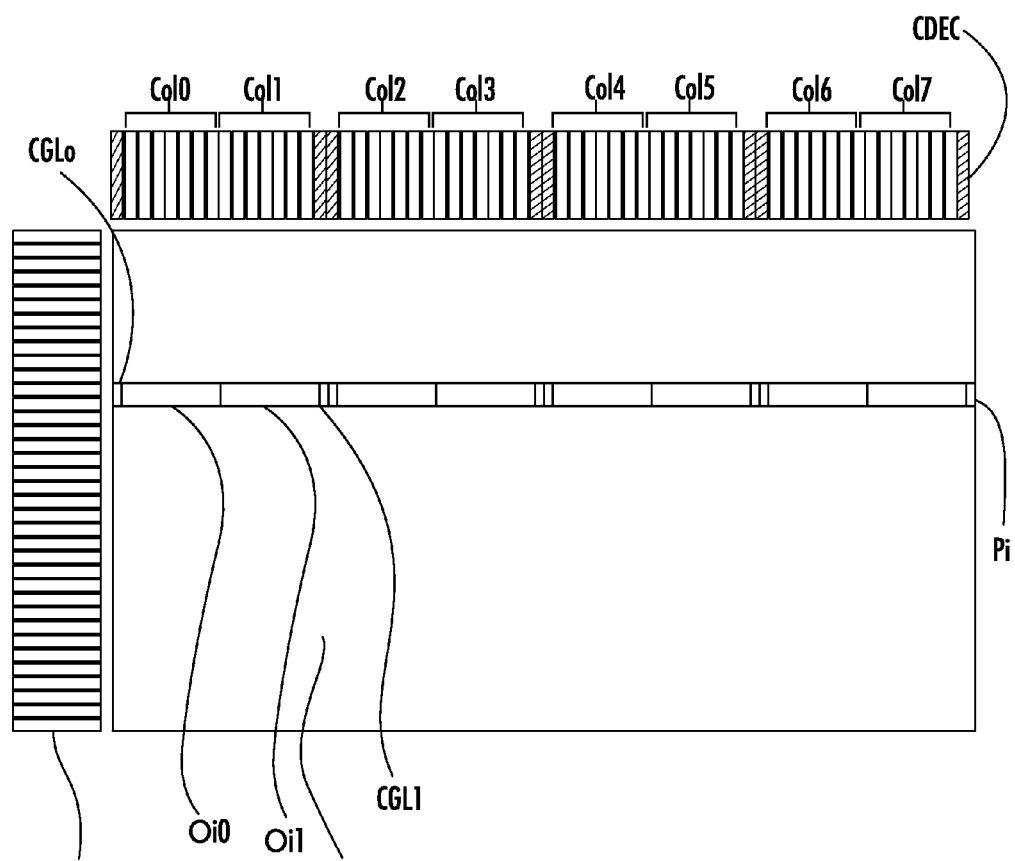
FIG. 3 is a schematic diagram of memory according to the prior art.
Figure 5:
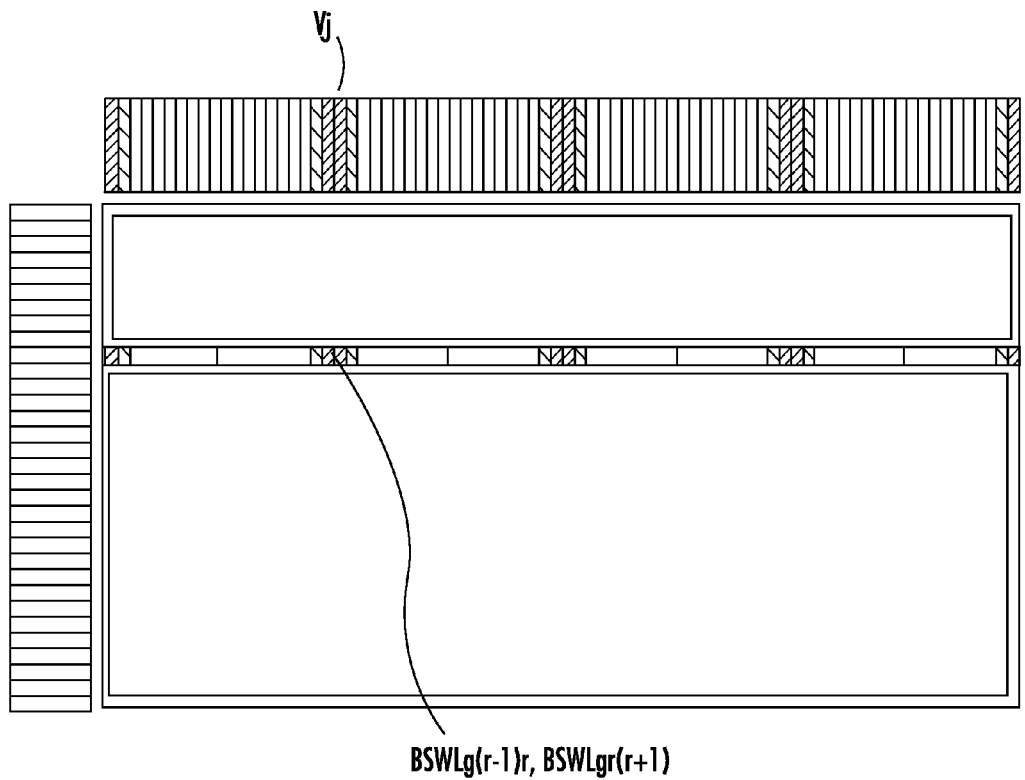
FIG. 5 is a schematic diagram of an electrically programmable memory according to an embodiment of the present invention.
Figure 6:
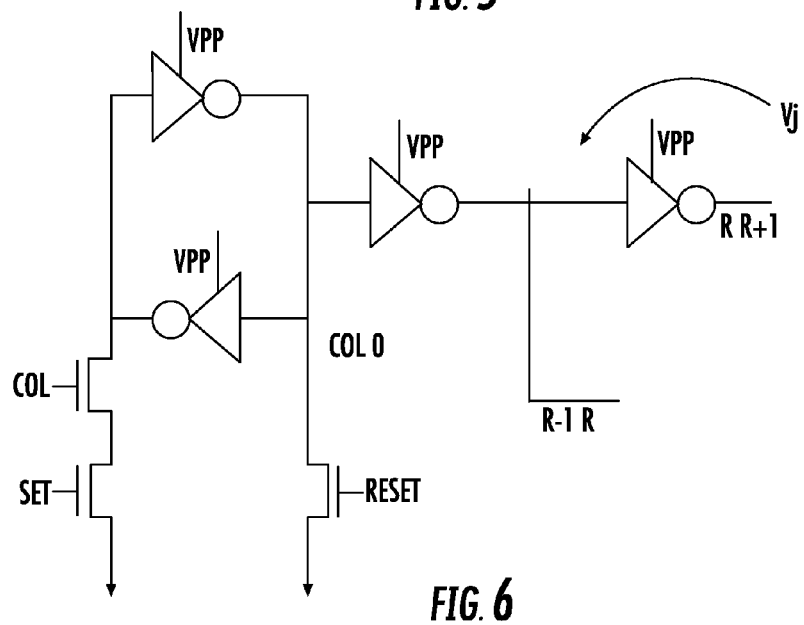
FIG. 6 is a schematic diagram of a global word line selection line latch for an electrically programmable memory according to an embodiment of the present invention.

FIG. 5 represents, more globally and schematically, a memory plane of an EEPROM memory according to the embodiment, and includes eight columns of 8 bits and 32 rows, i.e. a total of 2048 bits. This memory plane is therefore distinguished in this representation with respect to that of the prior art represented in FIG. 3 by the addition of the global word line selection lines BSWLg for each column, as was explained hereinabove. The word lines of the memory plane are not detailed, and the particular structure described hereinabove is not represented. The embodiment of this memory plane comprises, moreover, a per-column word line selection latch $V_j$, an embodiment of which is represented in FIG. 6 by way of example and the manner of operation of which will be detailed subsequently, and which makes it possible, at output, to fix the two signals (r−1)r and r(r+1), i.e., the opposite values 0 and 1 according to the convention chosen, which are transmitted to the two global word line selection lines $BSWLg_{(r-1)r}$ and $BSWLg_{r(r+1)}$.

A method for fabricating a memory plane of such a memory, in an integrated circuit form, comprises the customary steps of fabrication, especially of memory cells with transistors on integrated circuits, but adds the production of the following particular conductors, according to a method similar to that used for the production of the other conductors of the integrated circuit:

the global word lines extend over the length of the memory plane and are linked by switches, embodied by additional transistors to local word lines, which no longer extend over the whole length of the memory plane but over a single column, in contradistinction to the prior art, and which amount, ultimately, to the node common to all the gates of the access transistors AT of the same byte and to the gate of the gate control transistor CGT of this byte; and the global word line selection lines, which extend over the whole of the memory plane in the substantially perpendicular direction to ensure a control link for the additional transistors forming the switches to transmit control signals to them.

The memory architecture described hereinabove allows the implementation of an advantageous programming method. According to one embodiment, the programming method implements standardized programming cycles, for example, known by the name "page write". Each programming cycle includes the selection of an initial address $Ai_{ij}$ of a memory plane by its row i and its column j. In each programming cycle, the latches of the bits of row i and of column j are the first to be activated, as a function of the data to be stored, followed by those of the bits of the subsequent columns in the same row i, until the end of the row is reached, by incrementing the address of the bits in the increasing sense in the same row, as in the prior art. Thereafter, in each programming cycle, the activation of the latches continues by restarting from the first column, as in the prior art, but in the next row i+1, by automatic modification of the state of the global word line selection lines which pass from a first state "0-1" to the second state "1-0" (the values "1" and "0" are conventions for referring to the two possible states of the binary signals present on the two global word line selection lines associated with a column, and may be inverted or named differently), until reaching the final address $Af_{(i+1)jf}$, where jf represents the final column, which depends on the number of bytes to be programmed.

Thereafter, the programming cycle may thus ultimately program the selected bits to store the data, which lie on the memory on bits with increasing address, optionally on two consecutive lines. By this method, all the data are written on successive addresses. This method thus allows a programming cycle to automatically manage the incrementing of the write row, as a supplement to the already existing automatic incrementing for the addressing of the columns.

Figure 7:
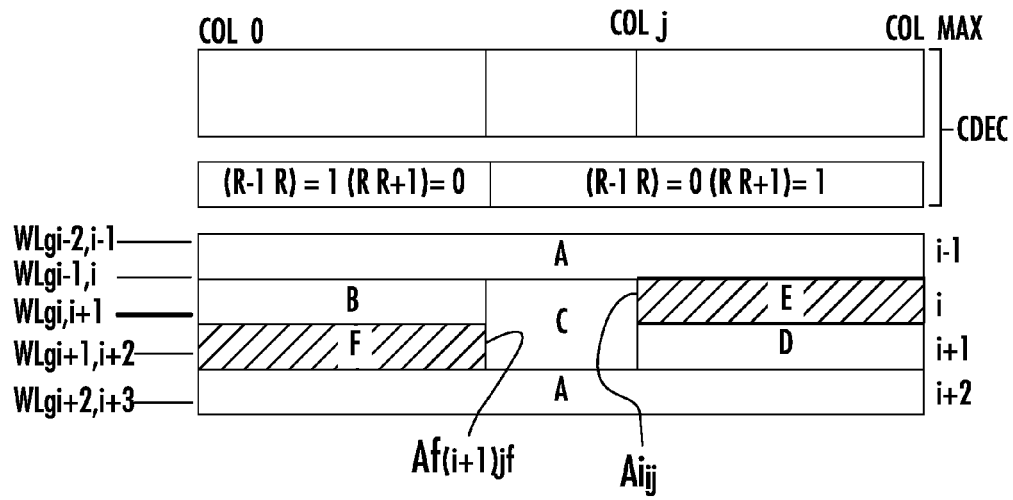
FIG. 7 is a schematic diagram of an exemplary manner of operation of the programming method according to an embodiment of the present invention.

FIG. 7 schematically illustrates the manner of operation of such a method. The data to be stored during a programming cycle are firstly stored in area E of the memory, which comprises row i starting from the selected column j, i.e. the initial address $Ai_{ij}$. Thereafter, the rest of the data to be stored is found in area F of this memory, which is situated in row i+1 starting from the first column, up to the final address $Af_{(i+1)jf}$. Note, area A which encompasses the rows below i−1 and above i+2 rows i and i+1 is not involved in this write cycle, as their local word lines are not able to be linked to the global word line $WLg_{i,i+1}$ activated during this cycle. Moreover, it is noted that area B, which represents the first columns of row i is not impacted by the operation, in contradistinction to the method of the prior art.

Each word line selection latch $V_j$, represented in FIG. 6, associated with the two global word line selection lines of each column j, receives the value 1 on its "col" input when the column to which it belongs is addressed, and initially receives the zero value on its "set" input as long as the last column of row i has not been reached, and therefore in area E of the memory plane (FIG. 7). Thereafter, during the detection of the latter column, this "set" value of the latch takes a second value "1", by way, for example, of a flip flop (not represented). Thus, it is possible to invert the output values (r−1)r and r(r+1) for the latches of the initial columns selected of area F (FIG. 7), and therefore changing a row of the memory plane, according to the mechanism explained previously.

Figure 8:
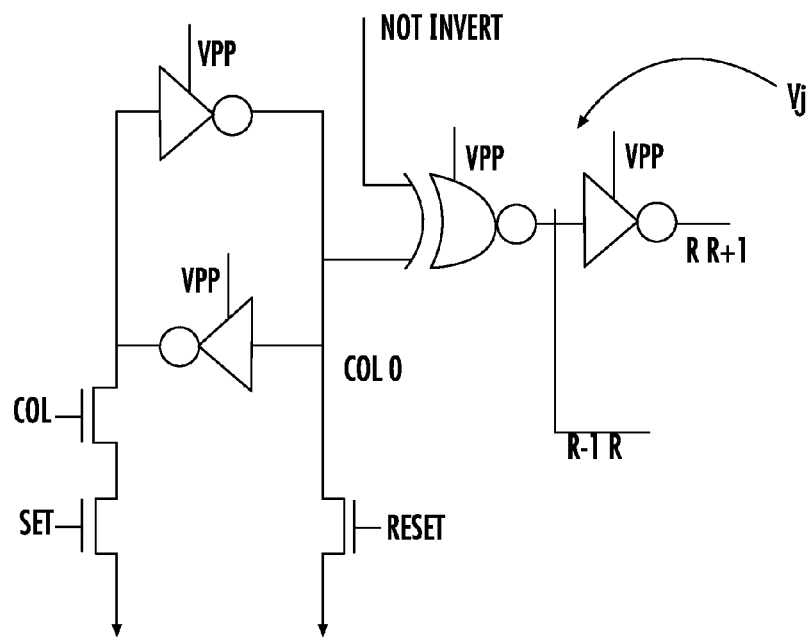
FIG. 8 is a schematic diagram of a global word line selection line latch for an electrically programmable memory according to an embodiment of the present invention.

FIG. 8 represents a variant embodiment of a word line selection latch configured to continuously and infinitely increment the addresses of the memory plane based upon an additional function for incrementing the global word lines of the memory. In this variant, if the size of the data to be stored exceeds that of a page, the programming method comprises the following additional prior steps during a programming cycle. When the size of the processed data exceeds the size of a page of the memory plane, then the global word line is incremented, and we pass from the global word line $WLg_{i(i+1)}$ to $WLg_{(i+1)(i+2)}$. At the same time, the "Not Invert" variable at the input of the Xor component of the latch $V_j$, which replaces an inverter of the previous embodiment illustrated by FIG. 6, as represented in FIG. 8, passes from 0 to 1, thereby inverting the output values (r−1)r and r(r+1) of the latch, so that the local word line $WLl_{(i+1)}$ is linked to the global word line $WLg_{(i+1)(i+2)}$. Thereafter, when the end of row i+1 is reached, the "set" variable of the latch Vj is again modified, as explained previously, and the local word line $WLl_{(i+2)}$ becomes linked to the global word line $WLg_{(i+1)(i+2)}$ and the steps explained previously are continued.

In this variant, the method thus allows the activation of the latches for the data to be stored, even if their size exceeds that of a memory page by systematically incrementing the address of the bits considered in the memory. Note that when a word line selection latch is activated in this activation phase, it is firstly systematically reinitialized (reset function) before its final positioning to one of its two possible positions, according to the steps explained hereinabove. Finally, when all the data to be stored have been processed, the write cycle of the programming cycle induces the storage of all the last data corresponding to the size of a page, the previous data not being stored.

The method previously described for managing the electronic memory has been implemented with the aid of a memory whose architecture has been tailored. However, this architecture has been described by way of example and in a non-limiting manner. It is possible to contemplate other embodiments, comprising, for example, some other organization, with other conductors and with at least one internal switch to offer the possibility of changing rows of the memory during a write cycle. Finally, this approach has been described with respect to a non-volatile memory of an EEPROM type, but it could also be implemented in some other type of electronic memory.

That which is claimed:

1. A method for electrically programming a non-volatile memory comprising:
    addressing a plurality of memory cells from an initial address corresponding to a first row and a first column of a memory plane; and
    addressing the plurality of memory cells in a second consecutive row when an end of the first row is reached to store data with consecutive and increasing addresses in two consecutive rows.

2. The method according to claim 1, further comprising modifying a state of global word line selection lines, which pass from a first state "0-1" to a second opposite state "1-0", when the end of the first row is reached to address the plurality of memory cells of the second consecutive row from the first column of the memory plane.

3. The method according to claim 1, further comprising detecting the end of the first row and activating at least one switch to continue the addressing of the second consecutive row based upon the detecting.

4. The method according to claim 1, further comprising changing a row by linking a global word line to a first local word line of a last column of the first row and linking the global word line to a second local word line of the first column of the second consecutive row.

5. The method according to claim 4, further comprising incrementing bits of the memory plane for data to be stored having a size greater than a size of a page of the memory plane by at least
    when a size of processed data exceeds the size of the page of the memory plane, incrementing the global word line and passing from a first global word line to a consecutive second global word line; and
    while passing from the first global word line to the consecutive second global word line, inverting output values of a latch for selecting the global word line so that the local word line is linked to the consecutive second global word line.

6. An electrically programmable non-volatile memory comprising:
    a plurality of memory cells arranged in columns and rows; and
    a device configured to
        address said plurality of memory cells from an initial address corresponding to a first row and a first column of said plurality of memory cells, and
        address said plurality of memory cells in a second consecutive row when an end of the first row is reached to store data with consecutive and increasing addresses in two consecutive rows.

7. The memory according to claim 6, wherein said plurality of memory cells of a row and of a column are configured to be linked to a local word line and to bit lines; and further comprising at least one switch configured to selectively link the local word line to a programming voltage.

8. The memory according to claim 7, wherein said at least one switch comprises a plurality of switches configured to each be driven by respective global word line selection lines and configured to selectively link the local word line to a voltage.

9. The memory according to claim 7, wherein the local word line extends only over one column in a given row, and is coupled to a gate of a transistor of each cell of the one column, said transistor having a drain coupled to a bit line.

10. The memory according to claim 8, wherein the voltage comprises a programming voltage; and wherein a link to a global word line extending over the length of the plurality of memory cells and configured to electrically link with the columns of the plurality of memory cells defines the link to the programming voltage for a local word line.

11. The memory according to claim 10 further comprising, per column, a plurality of global word line selection lines, and a global word line selection line latch configured to provide, as an output, opposite logic signals to be applied to each of the plurality of global word line selection lines to select a row to be programmed from among a plurality of rows when a given global word line is addressed by a write command.

12. The memory according to claim 7, wherein each of said plurality of memory cells comprises a floating gate transistor having a drain, and an access transistor having a gate coupled to the to the local word line, a drain coupled to a bit line, and a source coupled said drain of said floating gate transistor; further comprising a gate control transistor having a gate coupled to the local word line; and wherein said floating gate transistor has a control gate coupled to a gate control line via said gate control transistor.

13. A method of making a memory plane of electrically programmable non-volatile memory comprising a plurality of memory cells arranged in columns and rows, and a device configured to address the plurality of memory cells from an initial address corresponding to a first row and a first column of the memory plane, and address the plurality of memory cells in a second consecutive row when an end of the first row is reached to store data with consecutive and increasing addresses in two consecutive rows, the method comprising:
- forming conductors defining a plurality of global word lines extending over a length of the memory plane;
- forming conductors defining a plurality of local word lines extending over a single column of a row of the memory plane;
- forming transistors defining a plurality of switches between the plurality of global word lines and the plurality of local word lines; and
- forming conductors defining a plurality of global word line selection lines extending in a direction transverse to the plurality of global word lines, and joined to the plurality of switches for transmitting signals for controlling a configuration of the plurality of the switches.

14. The method of claim 13, wherein the plurality of switches are each driven by respective ones of the plurality of global word lines.

15. The method of claim 13, wherein the plurality of local word lines are each coupled to a gate of a respective transistor of each cell of the single column, the transistor having a drain coupled to a bit line.

* * * * *